(12) United States Patent
Wang et al.

(10) Patent No.: US 10,345,718 B2
(45) Date of Patent: Jul. 9, 2019

(54) PATTERN FORMING METHOD AND APPARATUS FOR LITHOGRAPHY

(71) Applicant: TAIWAN SEMICONDUCTOR MANUFACTURING CO., LTD., Hsinchu (TW)

(72) Inventors: Chung-Cheng Wang, Hsinchu (TW); Chun-Kuang Chen, Hsinchu County (TW); Chia-Cheng Chao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/597,897

(22) Filed: May 17, 2017

(65) Prior Publication Data

US 2018/0335706 A1    Nov. 22, 2018

(51) Int. Cl.
*G03B 27/42* (2006.01)
*G03F 7/20* (2006.01)
*H01L 21/67* (2006.01)

(52) U.S. Cl.
CPC ...... *G03F 7/70875* (2013.01); *G03F 7/70991* (2013.01); *H01L 21/67109* (2013.01)

(58) Field of Classification Search
CPC ......... H01L 21/67248; H01L 21/67184; H01L 21/67201; H01L 21/68; H01L 21/68707; G03F 7/38; G03F 7/40; H01J 37/32724; H01J 2237/2001; H01J 37/32715; H01J 2237/2007
See application file for complete search history.

(56) References Cited

U.S. PATENT DOCUMENTS

| | | | |
|---|---|---|---|
| 6,022,672 A * | 2/2000 | Ikeda | G03F 7/7075 430/325 |
| 2007/0071439 A1* | 3/2007 | Kaneyama | G03F 7/70991 396/611 |
| 2009/0008381 A1* | 1/2009 | Jyousaka | G03F 7/38 219/494 |
| 2010/0183807 A1* | 7/2010 | Kim | H01L 21/67017 427/248.1 |

* cited by examiner

*Primary Examiner* — Mesfin T Asfaw
(74) *Attorney, Agent, or Firm* — McDermott Will & Emery LLP

(57) ABSTRACT

In a pattern forming method, a resist layer disposed on a wafer is exposed by an energy beam. A post-exposure-bake (PEB) is performed on the wafer with the exposed resist layer by using a PEB apparatus. After the PEB, the exposed resist layer is developed, thereby forming a resist pattern. The PEB apparatus includes a baking plate, and the wafer is placed on the baking plate for the PEB when a temperature of the wafer is within a predetermined temperature range.

20 Claims, 7 Drawing Sheets

PATTERN FORMING METHOD AND APPARATUS FOR LITHOGRAPHY

TECHNICAL FIELD

This disclosure relates to pattern forming methods used in semiconductor manufacturing processes, and an apparatus for lithography.

BACKGROUND

Lithography has been a key process in a semiconductor manufacturing process for forming fine patterns. Critical dimension (CD) (e.g., width, length, etc.) of resist patterns formed by lithography is affected by various factors. Technologies to reduce CD variations have been developed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device/apparatus may be otherwise oriented (rotated 90 degrees or at other orientations) and the spatially relative descriptors used herein may likewise be interpreted accordingly. In addition, the term "made of" may mean either "comprising" or "consisting of." The order of the following operations can be changed. One or more additional operations may be performed during or after the following operations, and one or more of the following operations can be removed.

Figure 1:
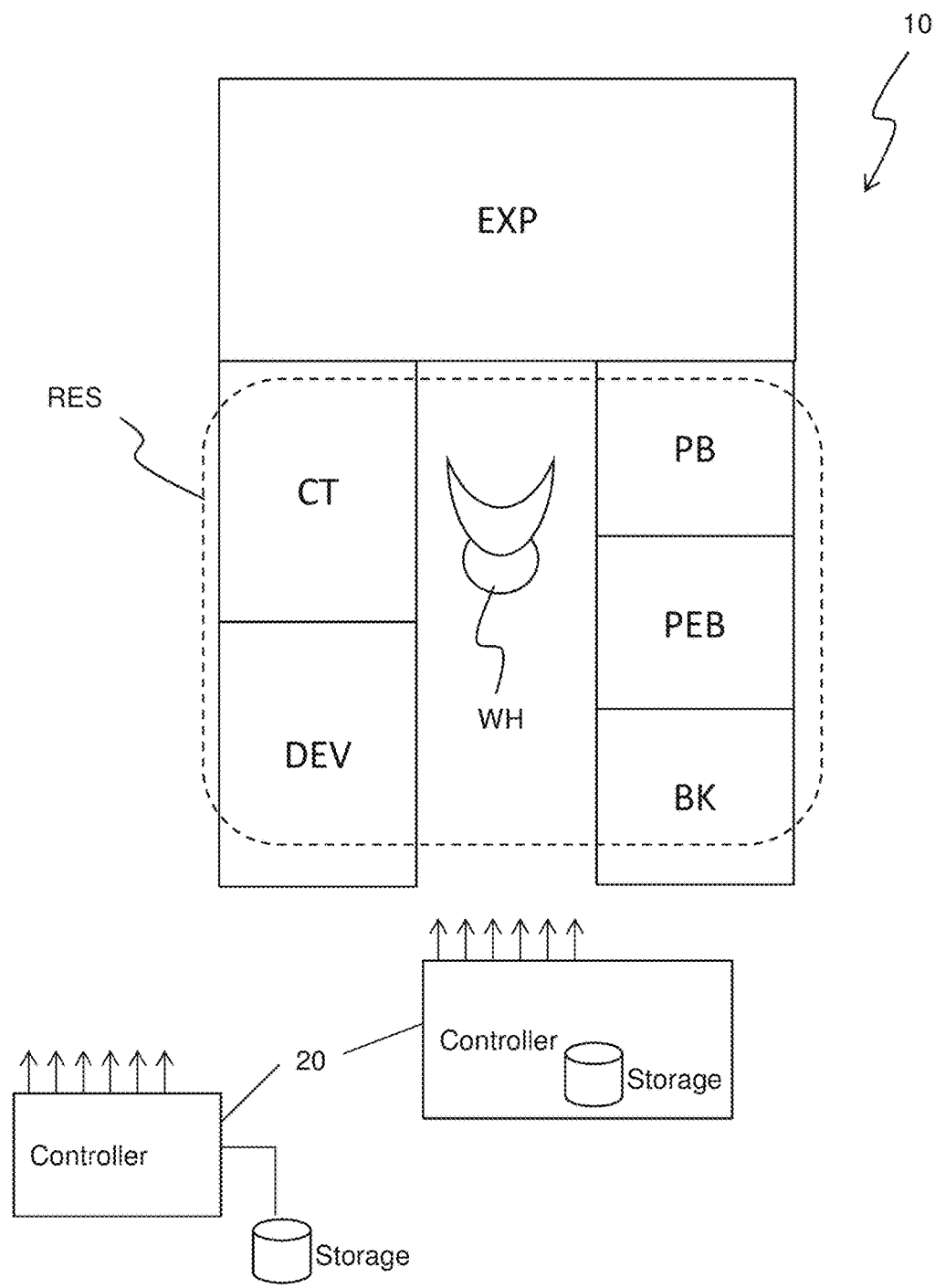
FIG. 1 shows an exemplary diagram of a lithography cluster.

FIG. 1 shows an exemplary diagram of a lithography cluster 10. The lithography cluster 10 includes a exposure apparatus EXP, such as an optical scanner, an optical stepper, an extreme ultra violet (EUV) exposure system or an electron beam exposure system, and a resist process apparatus RES. The resist process apparatus includes a resist coater CT, a resist developer DEV and various baking apparatuses, such as a pre-bake apparatus PB, a post-exposure-bake apparatus PEB, and a post-bake apparatus BK. Each baking apparatus includes a baking plate and a cooling plate. In some embodiments, a cooling plate is separately provided from the baking plate. Multiple baking apparatuses for each baking process may be provided in the lithography cluster 10 in some embodiments, and multiple resist coaters and multiple resist developers may be provided. The lithography cluster 10 further includes a wafer handling system WH including, for example, a robotic arm and/or a moving track, for transferring a wafer from one unit to another unit. Each unit of the lithography cluster 10 is controlled by one or more controllers 20. The controller 20 includes control circuity, such as a CPU or a microcomputer, and a storage unit that stores one or more control programs. The storage unit may be disposed inside the controller 20 or may be disposed outside the controller 20 and coupled to the controller 20. In other embodiments, the control circuitry is realized by a semiconductor IC or LSI. In some embodiments, each of the exposure apparatus EXP and the resist process apparatus RES has its own controller.

Figure 2:
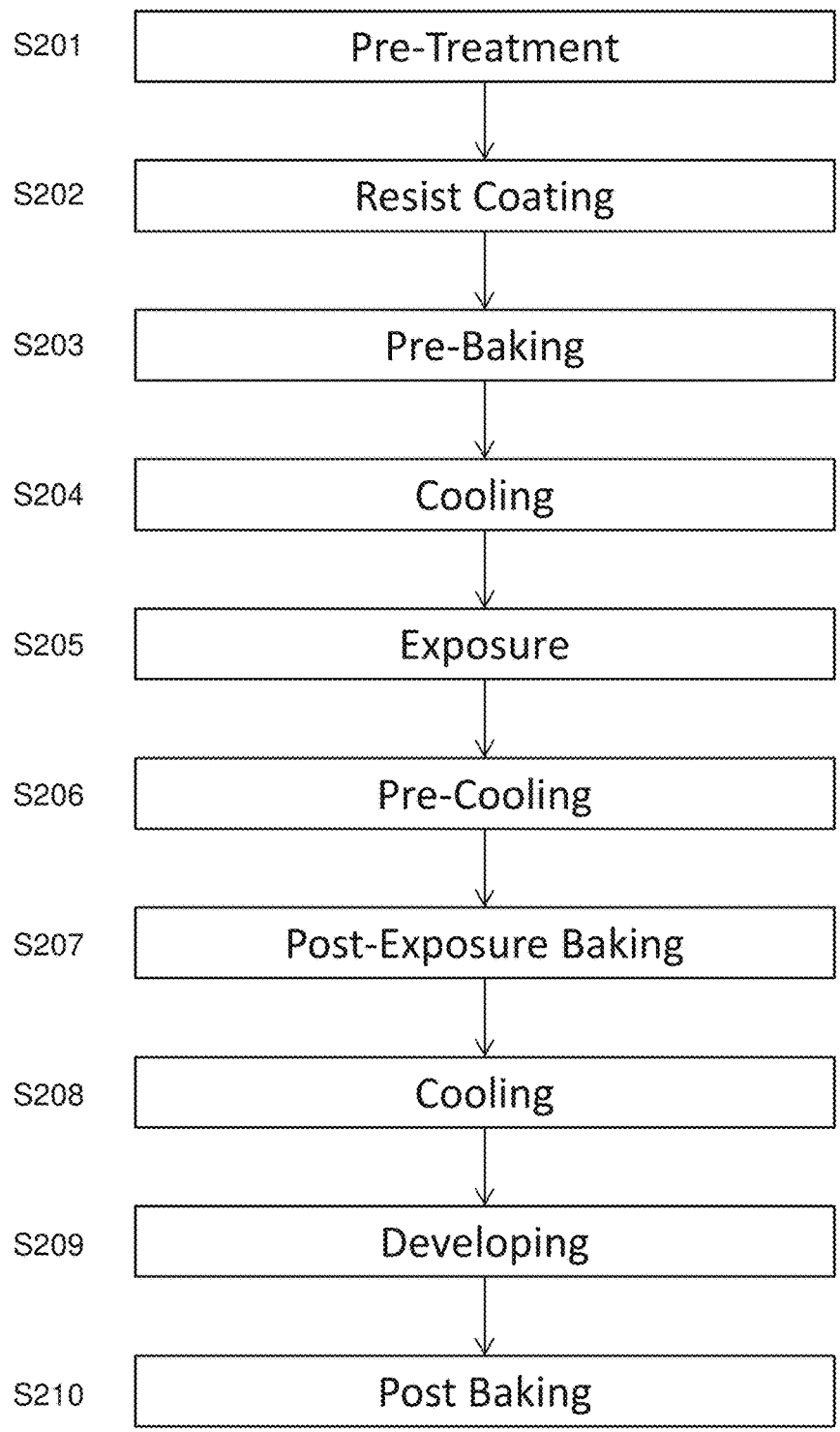
FIG. 2 shows an exemplary flow chart for a patterning operation in a lithography operation according to an embodiment of the present disclosure.

FIG. 2 shows an exemplary flow chart for a patterning operation in a lithography operation according to an embodiment of the present disclosure.

In S201, a wafer is pre-treated by using hexamethyldisilazane (HMDS) to increase the adhesion property between the wafer and a resist. The wafer may include underlying structure. In S202, a resist is coated on the wafer by the resist coater CT. In S203, the wafer coated with the resist is subjected to a pre-baking process by using a pre-bake apparatus PB. The temperature of the pre-baking is in a range from about 70-120° C. in some embodiments.

In S204, after the pre-baking, the wafer is then cooled by a cooling plate. The temperature of the cooling plate is in a range from about 20-30° C. in some embodiments and is typically at a room temperature (about 25° C.). In S205, after the cooling, the wafer is transferred to the exposure apparatus EXP, and an exposure process using UV, EUV, e-beam, or X-ray, is performed. By this exposure process, a circuit pattern formed on a photo mask is transferred into the resist.

In S206 and S207, after the exposure process, the wafer is subjected to a post-exposure-bake (PEB) process by the PEB apparatus PEB. In the PEB process, the wafer is first placed on a cooling plate and then the wafer is transferred to a baking plate. The temperature of the PEB is in a range from about 70-120° C. in some embodiments. The temperature of the cooling plate is in a range from about 20-30° C. in some embodiments and is typically at room temperature (about 25° C.).

After the PEB, the wafer is cooled at a cooling plate at S208, and then the wafer is transferred to the resist developer DEV. The temperature of the cooling plate is in a range from about 20-30° C. in some embodiments and is typically at room temperature (about 25° C.).

After the exposed resist is developed by using a suitable solution at S209, a resist pattern is formed on the wafer. After the resist development process, at S210, a post-baking process is performed. The temperature of the post-baking is in a range from about 100-130° C. in some embodiments.

FIGS. 3A-3E show exemplary processes of a post-exposure-bake (PEB) operation according to an embodiment of the present disclosure.

Figure 3A:
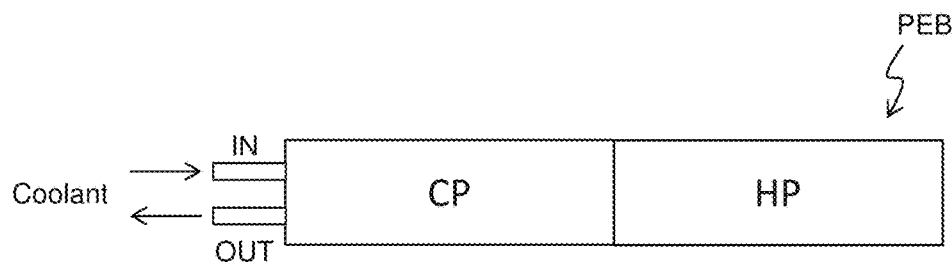
FIGS. 3A, 3B, 3C, 3D and 3E show exemplary processes of a post-exposure-bake operation according to an embodiment of the present disclosure.

As shown in FIG. 3A, a PEB apparatus PEB includes a baking (hot) plate HP and a cooling plate CP. In some embodiments, a cooling plate is separately provided from the PEB apparatus and multiple cooling plates may be provided.

The temperature of the baking plate HP can be set by a control program and is controlled by the controller. The cooling plate CP is cooled by a coolant, such as cooling water, and is maintained at the room temperature. The coolant is provided from an inlet IN and exits from an outlet OUT.

Figure 3B:
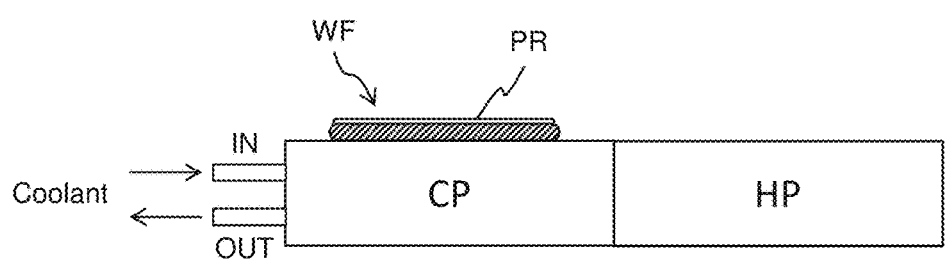
Figure 3C:
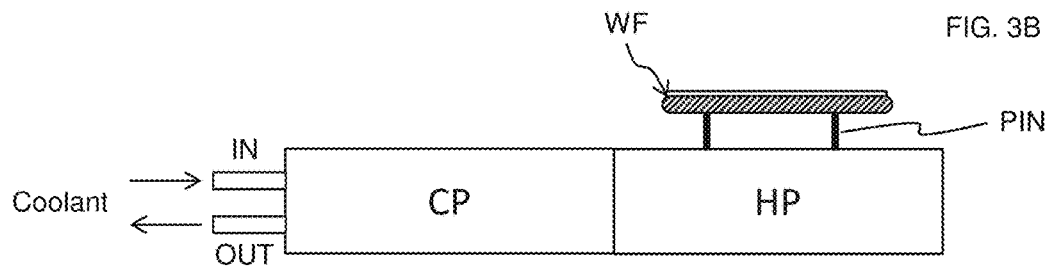
Figure 3D:
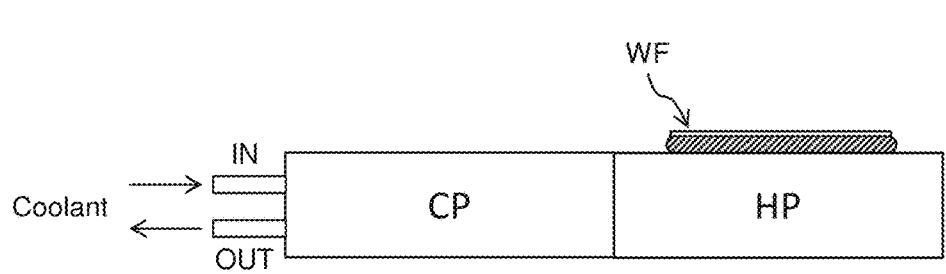
Figure 3E:
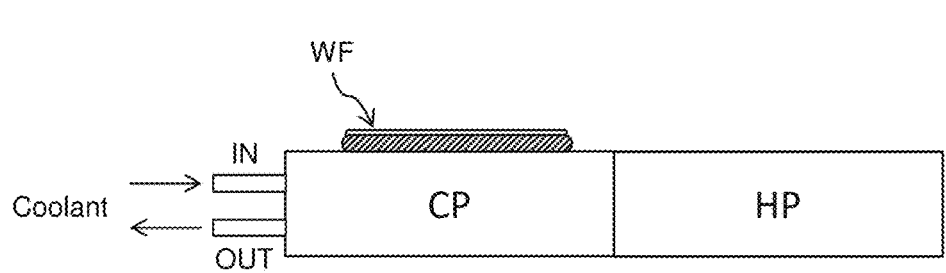

As shown in FIG. 3B, after a wafer WF with a resist PR is subjected to the exposure process, the wafer WF is transferred from the exposure apparatus EXP to the cooling plate CP of the PEB apparatus PEB. After being cooled for a predetermined time period (pre-cooling time period) T1, the wafer WF is transferred to the baking plate HP. As shown in FIG. 3C, the baking plate HP includes wafer up-down pins PIN. When receiving a wafer, the wafer up-down pins move up. After the wafer WF is placed on the wafer up-down pins PIN, the wafer up-down pins PIN move down so that the wafer WF is placed on the surface of the baking plate HP, as shown in FIG. 3D. In some embodiments, the wafer WF is held on the wafer up-down pins PIN while the wafer up-down pins PIN are up for a holding time period T2. After a baking time period T3, the wafer WF is placed on the cooling plate CP as shown in FIG. 3E. After a post-baking cooling time T4, the wafer WF is transferred to the resist developer DEV.

After one wafer is processed at the PEB apparatus, the next wafer is processed. In the semiconductor manufacturing process, a group (batch) of wafers is processed. For example, one wafer cassette may hold 1-25 wafers and one batch may be constituted by one or more cassettes. The diameter of the wafer is 12 inches (30 cm), 8 inches (20 cm) or 6 inches (15 cm). In a batch process, the first wafer to the N-th wafer (N being natural number of 2 or more) are sequentially processed. Generally, there is some interval time between one batch process and the next batch process.

When the first wafer of one batch is subjected to the PEB process, the first wafer is placed on the cooling plate, which is well maintained at the controlled temperature (e.g., room temperature) because of the interval time. After the first wafer is heated at the baking plate, the heated wafer is placed on the cooling plate, which causes a temperature increase of the cooling plate. After the first wafer is removed from the cooling plate, the next (second) wafer is placed on the cooling plate.

Here, since the cooling plate is heated by the first wafer, the temperature of the cooling plate is greater than the controlled temperature, when the second wafer is placed on the cooling plate. If the pre-cooling time period T1 is short, the second wafer will not be sufficiently cooled, and the second wafer will be placed on the baking plate with a temperature higher than the first wafer. In other words, the first wafer of one batch is always cooler than the subsequent wafers in the same batch, before being placed on the baking plate.

Figure 4A:
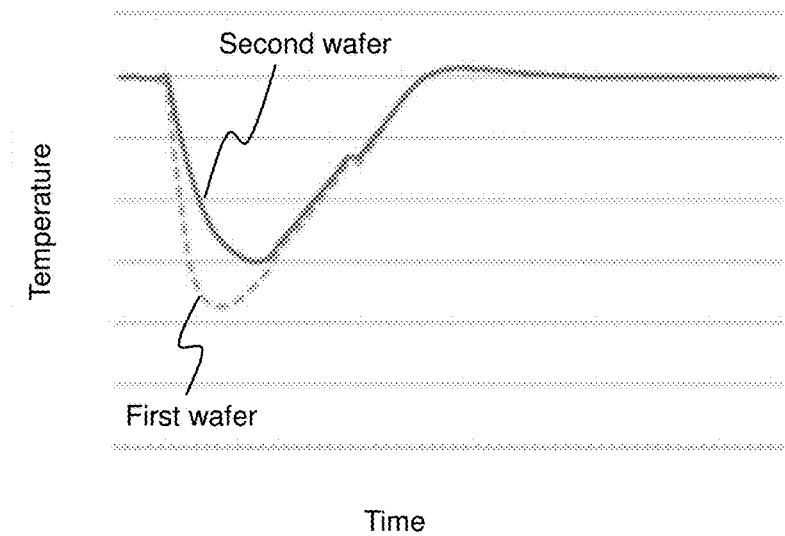
FIG. 4A shows a baking plate temperature change after the wafer is placed on a baking plate for a post-exposure bake process.

FIG. 4A shows a minimum wafer temperature change after the first and second wafers are placed on the baking plate. When a wafer at a lower temperature is placed on the baking plate, the temperature of the baking plate once drops and then increases to the controlled PEB temperature.

As set forth above, the first wafer is fully cooled to the controlled temperature (e.g., room temperature), while the temperature of the second wafer is higher than the first wafer. Accordingly, as shown in FIG. 4A, the minimum wafer temperature of the baking plate for the first wafer is lower than the minimum wafer temperature of the baking plate for the second wafer. In other words, the minimum wafer temperature of the first wafer during the PEB process is lower than the minimum wafer temperature of the second wafer during the PEB process.

Figure 4B:
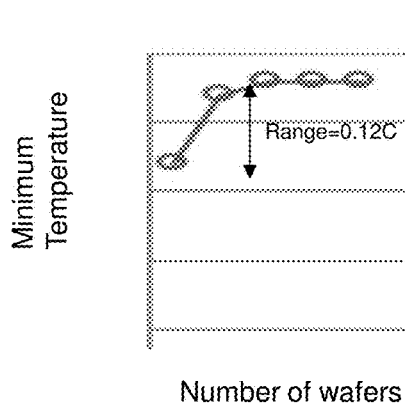
FIG. 4B shows minimum wafer temperatures during a post-exposure bake process for sequentially processed wafers.

For the third and subsequent wafers, the cooling plate status at the pre-cooling process is substantially the same. Accordingly, as shown in FIG. 4B, the minimum wafer temperature of the second and subsequent wafers are substantially the same (±0.02° C.). The difference of the minimum wafer temperature for the first wafer and the minimum wafer temperatures of the second and subsequent wafers (N-th wafers) is about 0.12° C.

Figure 4C:
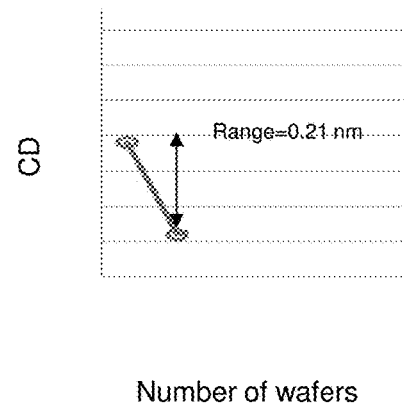
FIG. 4C shows a CD variation for sequentially processed wafers.

The difference in the minimum wafer temperature causes a critical dimension (CD) variation as shown in FIG. 4C. For example, the CD (e.g., line width) of the first wafer is about 0.21 nm greater than the CD of the second wafer.

In the present disclosure, to suppress such a CD variation, a wafer is placed on the baking plate when a temperature of the wafer is within a predetermined temperature range. The predetermined temperature range is equal to or less than 25° C. (room temperature) in some embodiments. In other embodiments, the predetermined temperature range is a target temperature (e.g., 25° C. or 70-120° C.)±0.05° C. In certain embodiments, the predetermined temperature range is a target temperature (e.g., 25° C. or 70-120° C.)±0.02° C.

In some embodiments, the wafer is placed on the cooling plate for a predetermined pre-cooling time period T1 so the temperature of the wafer becomes equal to or less than an upper limit of the predetermined temperature range, and then is placed on the baking plate for the PEB.

By placing the wafer on the cooling plate for a longer time period, it is possible to make the temperature of the wafer become equal to or less than an upper limit of the predetermined temperature range. When the temperatures of the wafers on the cooling plate are maintained at substantially the same temperature (i.e., in the predetermined temperature range, such as ±0.02° C.), the minimum temperature of the wafers when placed on the baking plate can be controlled at the substantially the same temperature (i.e., in a predetermined temperature range, such as ±0.02° C.).

Figure 5A:
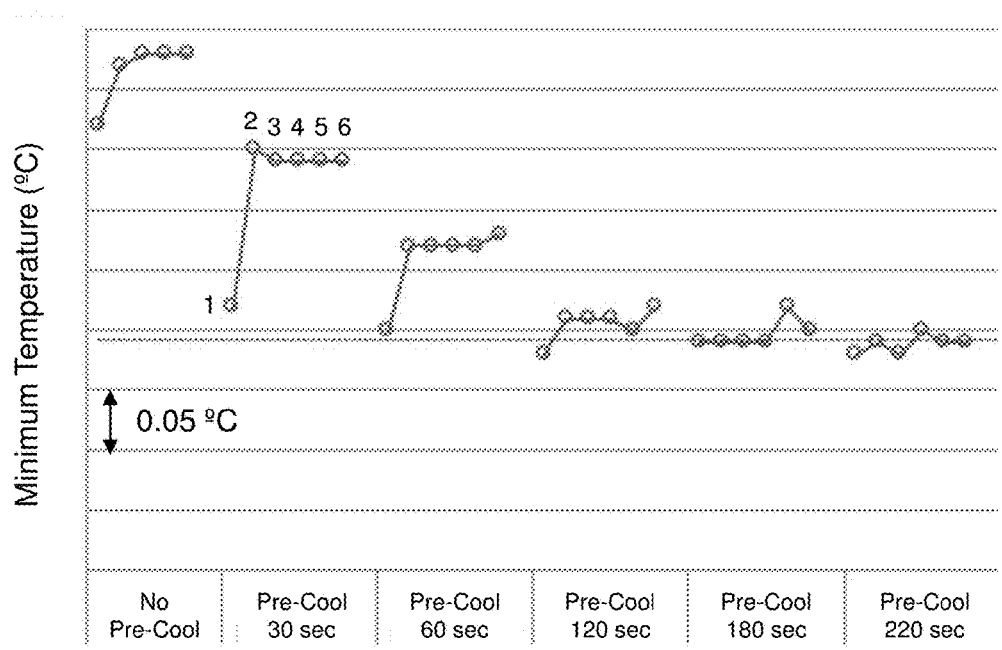
FIG. 5A shows minimum wafer temperatures during a post-exposure bake process for sequentially processed wafers with respect to various pre-cooling time periods.

FIG. 5A shows minimum wafer temperatures during a post-exposure bake process for sequentially processed wafers with respect to various pre-cooling time periods T1. For each cooling time period T1, the minimum temperatures of the first to fifth wafer were measured.

As shown in FIG. 5A, the longer the pre-cooling time period T1 is, the smaller the difference between the first wafer and the second to the fifth wafers in terms of the minimum wafer temperature is. For example, when the pre-cooling time period T1 is equal to or greater than 120 sec, the difference between the first wafer and the second to the fifth wafers is less than 0.05° C. According to FIG. 5A, the pre-cooling time period T1 is set from 2 min to 4 min. In this range, the minimum wafer temperatures can be maintained at an average minimum temperature (i.e., the average of the minimum wafer temperature of the first to N-th wafers) ±0.02° C. In certain embodiments, the T1 is about 2.5 min to about 3.5 min.

In some embodiments, in the batch process, the pre-cooling time period T1 for the first wafer is equal to or smaller than the pre-cooling time period T1 for the second to the subsequent wafers. In other words, the second to the subsequent wafers require a longer pre-cooling time period than the first wafer. The different cooling time periods can be set by a control program.

Further, in some embodiments, after the PEB heating process, the wafer is placed on the cooling plate for a post-baking cooling time T4, where T4 is in a range from about 30 sec to about 2 min. When the post-baking time T4 is longer, the heated wafer is sufficiently cooled by the cooling plate and thus the cooling plate temperature can return to the controlled temperature before the next wafer is placed on the cooling plate. Accordingly, similar to the prolonged pre-cooling time, the prolonged post-baking time can suppress the CD variation.

In some embodiments, the wafer is held for a holding time period T2 on the wafer up-down pins while the wafer up-down pins are up, where holding time period T2 is about 2 sec to about 5 sec. By holding the wafer on the pins, the wafer is heated by radiation from the heating plate. When the temperature of the heating plate is about 70-120° C., the wafer held at the pins may be heated at 65-115° C. By holding the wafer for about 2-5 seconds, the temperature of the wafer becomes equal to or more than a target temperature, or within a target range (e.g., a target temperature ±0.05° C.), and thus it is possible to substantially compensate insufficient pre-cooling for the second to the subsequent wafers.

In some embodiments, in the batch process, the holding time period T2 for the first wafer is equal to or greater than the holding time period T2 for the second to the subsequent wafers. In other words, the first wafer requires a longer holding time period than the second and subsequent wafers. By doing so, it is possible to substantially equalize the temperatures of the first wafer and the subsequent wafers just before being placed on the baking plate. The different holding time periods can be set by a control program.

Figure 5B:
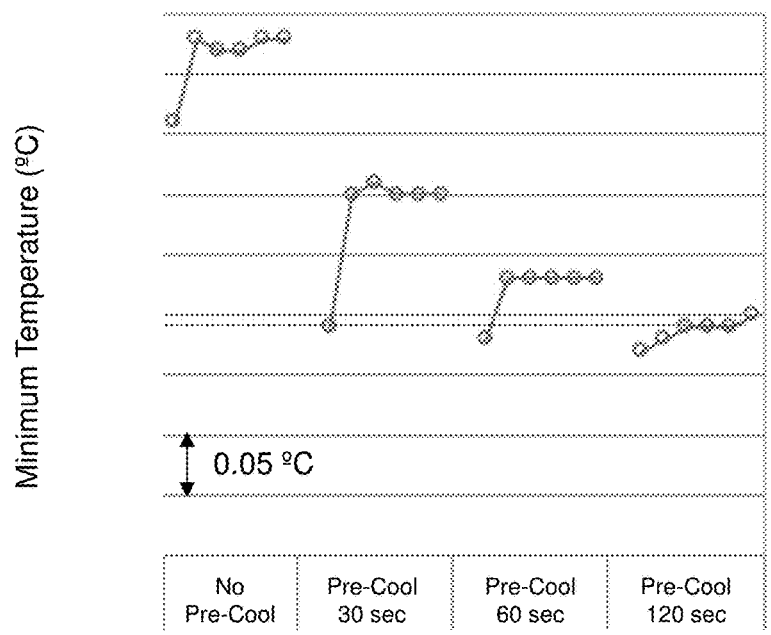
FIG. 5B shows minimum wafer temperatures during a post-exposure bake process for sequentially processed wafers with respect to various pre-cooling time periods, when a coolant flow rate is increased.

In other embodiments of the present disclosure, to increase cooling ability of the cooling plate CP, a flow rate of the coolant is increased. FIG. 5B shows minimum wafer temperatures during a post-exposure bake process for sequentially processed wafers with respect to various pre-cooling time periods, when a coolant flow rate is increased.

In FIGS. 5A and 5B, water is used as the coolant. In some embodiments, the coolant flow rate is in a range from about 8 l/min to about 18 l/min, and is in a range from about 10 l/min to about 15 l/min. In FIG. 5A, the flow rate of the coolant was set at 8 l/min, while in FIG. 5B, the flow rate was set at 11 l/min. As shown in FIG. 5B, increasing the coolant flow rate, it is more effectively reduces the difference in the minimum wafer temperatures for the first wafer and the subsequent wafers.

Figure 6A:
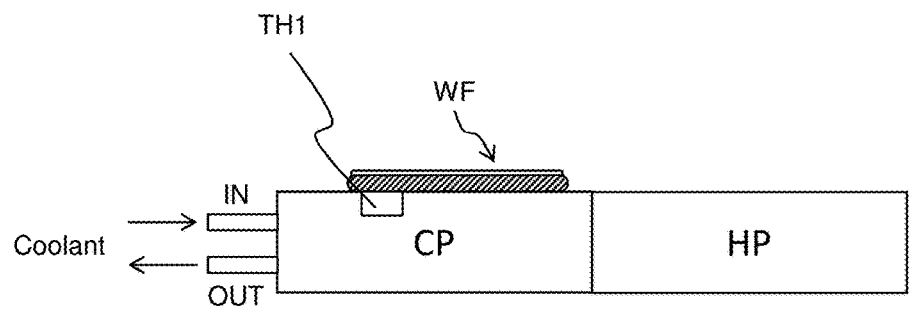
FIG. 6A shows an exemplary view of a post-exposure-bake apparatus according to some embodiments of the present disclosure.
Figure 6B:
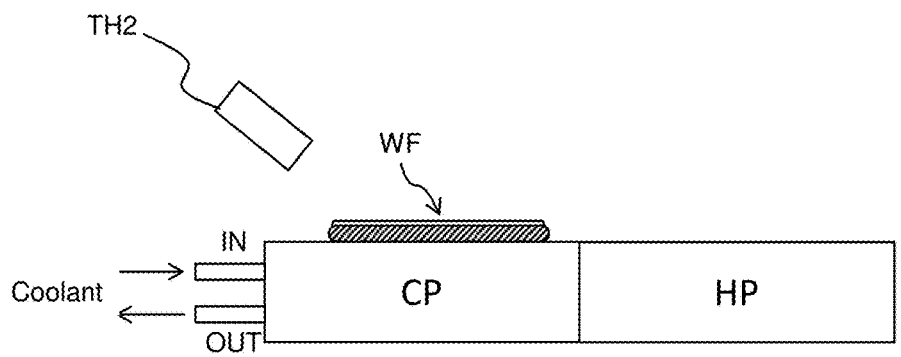
FIG. 6B shows an exemplary view of a post-exposure-bake apparatus according to some embodiments of the present disclosure.
Figure 6C:
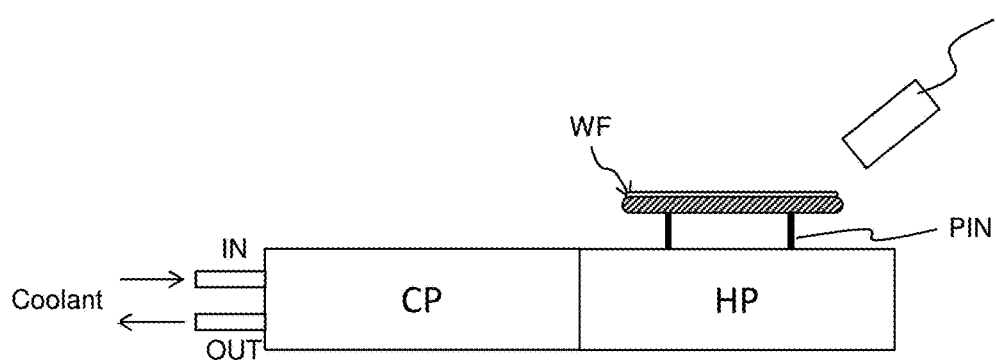
FIG. 6C shows an exemplary view of a post-exposure-bake apparatus according to some embodiments of the present disclosure.

FIGS. 6A-6C show exemplary views of a post-exposure-bake apparatus according to other embodiments of the present disclosure.

In FIG. 6A, a temperature sensor TH1 is provided in the cooling plate CP to monitor the temperature of wafers. The temperature sensor TH1 is communicably coupled to the controller 20 of FIG. 1. The temperature sensor TH1 is a thermocouple in some embodiments, and when the wafer is place on the cooling plate, the temperature sensor is in contact with the wafer or is located close to the wafer.

Before transferring the wafer to the baking plate HP, the temperature sensor TH1 monitors the temperature of the wafer, and when the temperature of the wafer reaches the predetermined range or below the predetermined threshold temperature, the wafer is transferred to the baking plate.

In FIG. 6B, a temperature sensor TH2 is provided to monitor the temperature of wafers on the cooling plate CP without contacting the wafer or the cooling plate. The temperature sensor TH2 is communicably coupled to the controller 20 of FIG. 1. The temperature sensor TH2 is an infrared temperature sensor in some embodiments.

Similar to FIG. 6A, before transferring the wafer to the baking plate HP, the temperature sensor TH2 monitors the temperature of the wafer, and when the temperature of the wafer becomes with the predetermined range or below the predetermined threshold temperature, the wafer is transferred to the baking plate.

In FIG. 6C, a temperature sensor TH3 is provided to monitor the temperature of wafers when the wafers are on the up-down pins PIN, without contacting the wafer. The temperature sensor TH2 is communicably coupled to the controller 20 of FIG. 1. The temperature sensor TH2 is an infrared temperature sensor in some embodiments.

Before placing the wafer on the baking plate HP, the temperature sensor TH3 monitors the temperature of the wafer, and when the temperature of the wafer reaches the predetermined range or below the predetermined threshold temperature, the wafer is moved down onto the baking plate.

In FIGS. 6A-6C, by directly monitoring the temperatures of the wafers before being placed on the baking plate, it is possible to substantially equalize the temperatures of the first wafer and the subsequent wafers just before being placed on the baking plate.

Figure 7A:
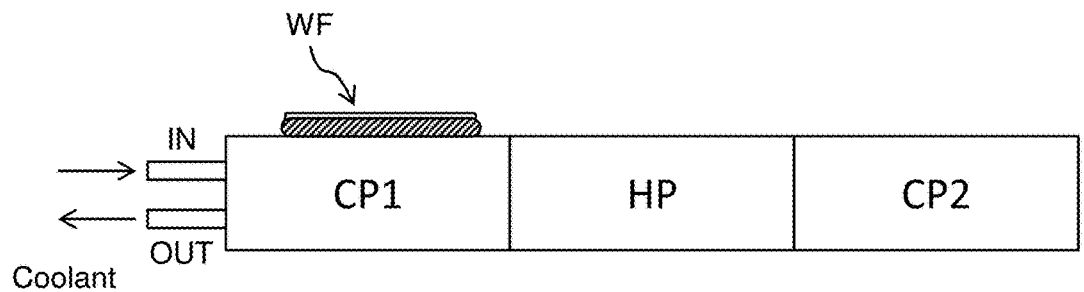
FIGS. 7A, 7B and 7C shows exemplary views of a post-exposure-bake apparatus and a post-exposure-bake process according to some embodiments of the present disclosure.
Figure 7B:
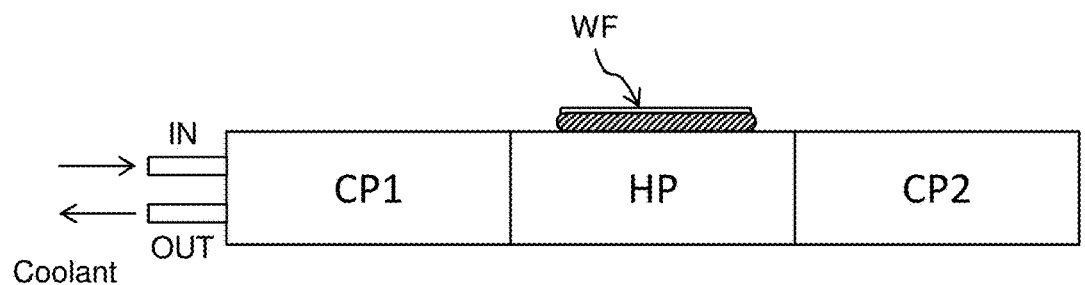
Figure 7C:
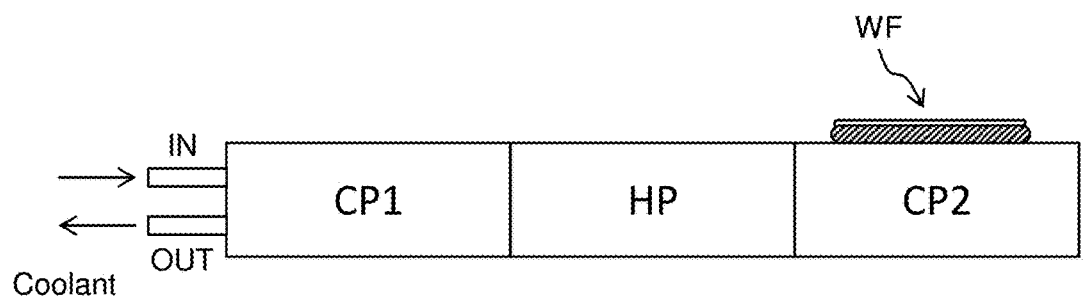

FIGS. 7A-7C show exemplary views of a post-exposure-bake apparatus and a post-exposure-bake process according to some embodiments of the present disclosure.

In FIGS. 7A-7C, the PEB apparatus includes a first cooling plate CP1 and a second cooling plate CP2. The configuration of the first and second cooling plate CP1 and CP2 is substantially the same as the cooling plate CP.

In FIGS. 7A-7C, the wafer is placed on the first cooling plate, which is a pre-cooling plate, for a predetermined time, and then transferred to the baking plate HP. After the PEB process, the wafer is transferred to the second cooling plate CP2, which is a post-cooling plate. Unlike the PEB apparatus and process of FIGS. 3A-3E, the heated wafer is not placed on the pre-cooling plate CP1, the temperature of the pre-cooling plate CP1 does not substantially change, or even if changed, the temperature of the pre-cooling plate CP1 can become the controlled temperature within a short period of time before the next wafer is placed thereon. Regarding the post-cooling plate CP2, the temperature of the post-cooling plate CP2 is increased by the heated wafer. However, during the PEB process of the next wafer, the temperature of the post-cooling plate CP2 becomes the controlled temperature. Thus, it is possible to substantially equalize the temperatures of the first wafer and the subsequent wafers just before being placed on the baking plate.

As set forth above, various embodiments to control the wafer temperatures are described. It is noted that two or more aforementioned techniques can be combined to more precisely control the wafer temperatures. Further, the foregoing techniques can be allied not only to a PEB process/apparatus, but also to any baking or heating processes/apparatuses for lithography processes.

It will be understood that not all advantages have been necessarily discussed herein, no particular advantage is required for all embodiments or examples, and other embodiments or examples may offer different advantages.

In the present disclosure, by controlling a temperature of a wafer just before being placed on the baking plate, it is possible to substantially equalize the temperatures of the first wafer and the subsequent wafers just before being placed on the baking plate, and thus it is possible to suppress CD variations of the developed resist patterns.

According to one aspect of the present disclosure, in a pattern forming method, an energy beam is exposed on a resist layer disposed on a wafer. A post-exposure-bake (PEB) is performed on the wafer with the exposed resist layer by using a PEB apparatus. After the PEB, developing the exposed resist layer, thereby forming a resist pattern. The PEB apparatus includes a baking plate, and the wafer is placed on the baking plate for the PEB when a temperature of the wafer is within a predetermined temperature range. In an embodiment, the PEB apparatus further includes a cooling plate, and the wafer is placed on the cooling plate for a first time period so the temperature of the wafer becomes equal to or less than an upper limit of the predetermined temperature range, and then is placed on the baking plate for the PEB. In an embodiment, the first time period is 2 min to 4 min. In an embodiment, after the PEB, the wafer is placed on the cooling plate for a second time period. In an embodiment, the second time period is 30 sec to 2 min. In an embodiment, the baking plate includes wafer up-down pins, and the wafer is held on the wafer up-down pins while the wafer up-down pins are up prior to the PEB, such that, when the temperature of the wafer becomes equal to or more than a lower limit of the predetermined temperature range, the wafer is placed on the baking plate by lowering the wafer up-down pins. In an embodiment, the wafer is held on the wafer up-down pins while the wafer up-down pins are up for a holding time period until the temperature of the wafer is within the predetermined temperature range. In an embodiment, the holding time period is 2 sec to 5 sec.

According to another aspect of the present disclosure, in a pattern forming method, first to N-th wafers are processed, where N is a natural number greater than 1. In the method, a post-exposure-bake (PEB) is performed on the first wafer with an exposed resist layer by using a PEB apparatus. After the PEB, the exposed resist layer is developed, thereby forming a resist pattern. The PEB and the developing are repeated so that the first to the N-th wafers are sequentially processed. The PEB apparatus includes a baking plate for the PEB. A wafer temperature before placing the wafer on the baking plate is controlled such that minimum wafer temperatures for the first to the N-th wafer during the PEB fall within a predetermined temperature range. In an embodiment, the PEB apparatus further includes a cooling plate, the first wafer is placed on the cooling plate for a first time period and the second to the N-th wafer is placed on the cooling plate for a second time period, and the second time period is equal to or greater than the first time period. In an embodiment the first time period is equal to the second time period and is 2 min to 4 min. In an embodiment, the second time period is greater than the first time period, and the second time period is 2 min to 4 min. In an embodiment, after the PEB, the wafer is placed on the cooling plate for a post-cooling time period. In an embodiment, the post-cooling time period is 30 sec to 2 min. In an embodiment, the predetermined temperature range is an average minimum temperature ±0.02° C., the average minimum temperature being an average of the minimum wafer temperatures for the first to the N-th wafers. In an embodiment, the baking plate includes wafer up-down pins, before being placed on the baking plate, the first wafer is held on the wafer up-down pins while the wafer up-down pins are up for a first holding time period and the second to the N-th wafers are held on the wafer up-down pins while the wafer up-down pins are up for a second holding time period, and the first holding time period is equal to or greater than the second holding time period. In an embodiment, the first and second holding time periods are 2 sec to 5 sec, respectively. In an embodiment, the first holding time period is greater than the second holding time period.

According to yet another aspect of the present disclosure, a baking apparatus includes a baking plate, a cooling plate, a wafer transportation arm and control circuitry for controlling the baking plate, the cooling plate and wafer transportation arm. The control circuity controls the wafer transportation arm and the baking plate to place a wafer on the baking plate at least one of (i) after the wafer is cooled at the cooling plate for a first time period of 1 min to 5 min, and (ii) after the wafer is held above the baking plate for a second time period of 2 sec to 5 sec. In an embodiment, at least one of the first time period and the second time period is variable within one batch operation for plural wafers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pattern forming method, comprising:
    exposing an energy beam on a resist layer disposed on a wafer;
    performing a post-exposure-bake (PEB) on the wafer with the exposed resist layer by using a PEB apparatus; and
    after the PEB, developing the exposed resist layer, thereby forming a resist pattern,
    wherein the PEB apparatus includes a baking plate and the wafer is placed on the baking plate for the PEB when a temperature of the wafer is within a predetermined temperature range, wherein the baking plate comprises wafer up-down pins, and wherein prior to the PEB, the wafer is heated by radiation from the baking plate while being held on the wafer up-down pins and the wafer up-down pins are up.

2. The pattern forming method of claim 1, wherein: the PEB apparatus further includes a cooling plate, and the wafer is placed on the cooling plate for a first time period so the temperature of the wafer becomes equal to or less than an upper limit of the predetermined temperature range, and then is placed on the baking plate for the PEB.

3. The pattern forming method of claim 2, wherein the first time period is 2 min to 4 min.

4. The pattern forming method of claim 2, wherein after the PEB, the wafer is placed on the cooling plate for a second time period.

5. The pattern forming method of claim 4, wherein the second time period is 30 sec to 2 min.

6. The pattern foil ling method of claim 1, wherein: when the temperature of the wafer becomes equal to or more than a lower limit of the predetermined temperature range, the wafer is placed on the baking plate by lowering the wafer up-down pins.

7. The pattern forming method of claim 6, wherein the wafer is held on the wafer up-down pins while the wafer up-down pins are up for a holding time period until the temperature of the wafer is within the predetermined temperature range.

8. The pattern forming method of claim 7, wherein the holding time period is 2 sec to 5 sec.

9. A pattern forming method, by which first to N-th wafers are processed, N being a natural number greater than 1, the method comprising:
performing a post-exposure-bake (PEB) on the first wafer with an exposed resist layer by using a PEB apparatus; and
after the PEB, developing the exposed resist layer, thereby forming a resist pattern, wherein:
the PEB and the developing are repeated so that the first to the N-th wafers are sequentially processed,
the PEB apparatus includes a baking plate for the PEB,
a wafer temperature before placing each wafer on the baking plate is controlled such that minimum wafer temperatures for the first to the N-th wafers during the PEB fall within a predetermined temperature range, and
the baking plate comprises wafer up-down pins and prior to the PEB, the first to the N-th wafers are heated by radiation from the baking plate while being held on the wafer up-down pins and the wafer up-down pins are up.

10. The pattern forming method of claim 9, wherein: the PEB apparatus further includes a cooling plate, the first wafer is placed on the cooling plate for a first time period and each one of the second to the N-th wafers is placed on the cooling plate for a second time period, and the second time period is equal to or greater than the first time period.

11. The pattern forming method of claim 10, wherein the first time period is equal to the second time period and is 2 min to 4 min.

12. The pattern forming method of claim 10, wherein: the second time period is greater than the first time period, and
the second time period is 2 min to 4 min.

13. The pattern forming method of claim 10, wherein after the PEB, the wafer is placed on the cooling plate for a post-cooling time period.

14. The pattern forming method of claim 13, wherein the post-cooling time period is 30 sec to 2 min.

15. The pattern forming method of claim 9, wherein the predetermined temperature range is an average minimum temperature $\pm 0.02°$ C., the average minimum temperature being an average of minimum wafer temperatures for the first to the N-th wafers.

16. The pattern forming method of claim 9, wherein: before being placed on the baking plate, the first wafer is held on the wafer up-down pins while the wafer up-down pins are up for a first holding time period and the second to the N-th wafers are held on the wafer up-down pins while the wafer up-down pins are up for a second holding time period, and
the first holding time period is equal to or greater than the second holding time period.

17. The pattern forming method of claim 16, wherein the first and second holding time periods are between 2 seconds and 5 seconds.

18. The pattern forming method of claim 17, wherein the first holding time period is greater than the second holding time period.

19. A baking apparatus, comprising:
a baking plate that comprises wafer up-down pins;
a cooling plate;
a wafer transportation arm; and
control circuitry for controlling the baking plate, the cooling plate, the wafer up-down pins, and the wafer transportation arm, wherein:
the control circuitry controls the wafer transportation arm and the baking plate to place a wafer on the baking plate for a PEB when a temperature of a wafer is within a predetermined temperature range by at least one of (i) cooling the wafer prior to the PEB at the cooling plate for a first time period of 1 min to 5 min, and (ii) heating the wafer prior to the PEB by radiation from the baking plate while the wafer is held above the baking plate on the wafer up-down pins and the wafer up-down pins are up for a second time period of 2 sec to 5 sec.

20. The baking apparatus of claim 19, wherein at least one of the first time period and the second time period is variable within one batch operation for plural wafers.

* * * * *